US008881089B1

(12) United States Patent
Alpert et al.

(10) Patent No.: US 8,881,089 B1
(45) Date of Patent: Nov. 4, 2014

(54) PHYSICAL SYNTHESIS OPTIMIZATION WITH FAST METRIC CHECK

(71) Applicant: International Business Machines Corporation, Armonk, NY (US)

(72) Inventors: Charles Jay Alpert, Austin, TX (US); Glenn R. Bee, Elgin, TX (US); Zhuo Li, Cedar Park, TX (US); Tuhin Mahmud, Austin, TX (US); Stephen T. Quay, Austin, TX (US); Lakshmi N. Reddy, Briarcliff Manor, NY (US); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/108,786

(22) Filed: Dec. 17, 2013

(51) Int. Cl.
G06F 17/50 (2006.01)

(52) U.S. Cl.
CPC ................... *G06F 17/5068* (2013.01)
USPC ............ 716/134; 716/132; 716/133; 716/135

(58) Field of Classification Search
CPC .............. G06F 17/5068; G06F 17/505; G06F 17/5077; G06F 17/5036; G06F 17/5031; G06F 17/5054; G06F 17/5072; G06F 17/5022; G06F 17/5081; G06F 17/5045
USPC ................... 716/132, 133, 134, 135
See application file for complete search history.

(56) References Cited

U.S. PATENT DOCUMENTS

| 5,784,289 | A | 7/1998 | Wang |
| 5,914,887 | A | 6/1999 | Scepanovic et al. |
| 6,493,658 | B1 | 12/2002 | Koford et al. |
| 7,137,097 | B1 * | 11/2006 | Aji et al. ............ 716/129 |
| 7,958,466 | B1 * | 6/2011 | Fung .................. 716/100 |
| 8,141,017 | B2 | 3/2012 | Papa et al. |
| 2004/0044979 | A1 | 3/2004 | Aji et al. |
| 2007/0220522 | A1 | 9/2007 | Coene et al. |
| 2008/0288905 | A1 | 11/2008 | Alpert et al. |
| 2009/0254874 | A1 | 10/2009 | Bose |
| 2009/0319977 | A1 | 12/2009 | Saxena et al. |
| 2013/0086544 | A1 | 4/2013 | Alpert et al. |

OTHER PUBLICATIONS

"Create a Better Starting Point for Faster Physical Implementation", Synopsys Accelerating Innovations Obtained from internet: http://www.synopsys.com/tools/implementation/rtlsynthesis/dcgraphical/Pages/default.aspx 2013 , 11 pages.
Alpert, Charles J. et al., "Porosity-Aware Buffered Steiner Tree Construction", IEEE Transactions on Computer-Aided Design of Integrated Circuits and Systems, vol. 23, No. 4 Apr. 2004 , 10 pages.

(Continued)

*Primary Examiner* — Vuthe Siek
(74) *Attorney, Agent, or Firm* — DeLizio Gilliam, PLLC

(57) ABSTRACT

A system, process, etc. according to some embodiments, which includes operations that include selecting one of a plurality of solutions ("selected solution") for optimization of an integrated circuit design during physical synthesis. The operations can further include performing on the selected solution a fast evaluation of a specific metric without updating design documents (e.g., without updating a netlist or metric map). If the evaluation of the specific metric is non-satisfactory, then the candidate solution is rejected. If the evaluation of the specific metric is satisfactory, then a design document is updated and a full evaluation of the specific metric (and other metrics) can be performed.

14 Claims, 5 Drawing Sheets

(56) References Cited

OTHER PUBLICATIONS

Alpert, Charles J. et al., "Techniques for Fast Physical Synthesis", IEEE, Proceedings of the IEEE, vol. 95, No. 3 Mar. 2007, 27 pages.

Clarke, Mike et al., "Eliminating Routing Congestion Issues with Logic Synthesis", Obtained from internet: www.Cadence.com, 7 Pages.

Cong, Jason et al., "MARS—A Multilevel Full-Chip Gridless Routing System", IEEE Transactions on Computer-Aided Design of Integrated Circuits and Systems, vol. 24, No. 3 Mar. 2005, 13 pages.

Dayan, Tal, "Rubber-Band Based Topological Router", University of California, Santa Cruz Jun. 1997, 161 pages.

Hrkic, Milos, "Tree Optimization and Synthesis Techniques with Applications in Automated Design of Integrated Circuits", B.S., Unversity of Illinois at Chicago 2000, 142 pages.

Li, Zhuo et al., "What is Physical Synthesis?", ACM/SIGDA E-Newsletter, vol. 41, No. 1 Jan. 1, 2011, 3 pages.

Pandini, Davide et al., "Congestion-Aware Logic Synthesis", STMicroelectronics, Central R&D, Italy 2002, 8 pages.

Sood, Ankush, "Automatically Identify, Fix, and Prevent Congestion With RTL Compiler Physical", Internet Site: http://www.cadence.com/Community/blogs/Id/archive/2009/08/11/automatically-identifying-fixing-and-preventing-congestion-with-rtl-compiler-physical.aspx Aug. 11, 2009, 2 pages.

Sze, C.N. et al., "A Place and Route Aware Buffered Steiner Tree Construction", Dept. of Electrical Engineering, Texas A&M University 2004, 6 pages.

Sze, Chin Ngai, "Algorithms for the Scaling Toward Nanometer VLSI Physical Synthesis", Texas A&M University Dec. 2005, 156 pages.

Taghavi, Taraneh et al., "Tutorial on Congestion Prediction", Computer Science Department, University of California 2007, 10 pages.

Taneja, Sanjiv, "Physical-Aware, High-Capacity RTL Synthesis for Advanced Nanometer Designs", Obtained from internet: www.cadence.com Mar. 4-6, 2013, 23 pages.

Wenting, Hou et al., "A Multi-Step Standard-Cell Placement Algorithm of Optimizing Timing and Congestion Behavior", Science in China (Series F) vol. 45 No. 4, Department of Computer and Technology, Tsinghua University Aug. 2002, 11 pages.

Westra, Jurjen, "Congestion Analysis and Management", Eindhoven University of Technology Library 2009, 189 pages.

\* cited by examiner

PHYSICAL SYNTHESIS OPTIMIZATION WITH FAST METRIC CHECK

BACKGROUND

Embodiments of the inventive subject matter generally relate to the field of computers and, more particularly, to electronic design automation.

The design of integrated circuits (ICs), also referred to as "chips" or "microchips", involve millions to billions of electrical components that need to be laid out and connected on a relatively small area of semiconductive material (e.g., the size of a fingernail or smaller). Before committing the circuit to fabrication, design engineers must determine the optimal configuration for the placement of the electrical components and for their connections (called "nets" or "wiring"). These design engineers use tools called electronic design automation (EDA) tools.

The portion of the design process for the IC that includes determining the optimal configuration for the placement and connection of the components is generally referred to as "physical synthesis." The purpose of physical synthesis is to place the design for the IC (including the placement of components and wiring that connects the components), recognize delays and signal integrity issues introduced by the wiring, and fix the problems. If required timing criteria (e.g., timing constraints) of the design is no longer satisfied because of the positioning and wiring, then portions of the design need to be changed. For example, buffer amplifiers (buffers) and inverters may need to be added to certain portions of the design circuitry to improve signal transmission between the components and to prevent one portion of the design circuitry from interfering with a desired operation of another part of the design circuitry; a component or group of components may need to be reassigned to one of various metal layers; different logic gates may need to be changed in size, position, or power levels; gates and combinational logic may need to cloned; design elements may need to be modified to change gate threshold voltage levels to improve a speed or frequency of a gate; and so forth.

Because the IC design is so complex, different portions of the IC design are separately worked on and modified during physical synthesis. Thus, any required change in one portion of the IC design can potentially affect portions of the IC design that were previously worked on. Therefore, stages of the physical synthesis may need to revisited and addressed in an iterative manner, using the EDA tools, until all timing criteria is satisfied (i.e., until the design closes on timing). Consequently, physical synthesis can be a time consuming and laborious process.

SUMMARY

A system, process, etc. according to some embodiments, which includes operations that include selecting one of a plurality of solutions ("selected solution") for optimization of an integrated circuit design during physical synthesis. The operations can further include performing on the selected solution a fast evaluation of a specific metric without updating design documents (e.g., without updating a netlist or metric map). If the evaluation of the specific metric is non-satisfactory, then the candidate solution is rejected. If the evaluation of the specific metric is satisfactory, then a design document is updated and a full evaluation of the specific metric (and other metrics) can be performed.

For example, the operations can include selecting one of a plurality of solutions for optimization of an integrated circuit design during a physical synthesis process. The operations can further include performing an evaluation of the one of the plurality of solutions for a non-sensitive metric. The operations can further include determining, based on the evaluation of the one of the plurality of solutions for the non-sensitive metric, that the non-sensitive metric exceeds an optimization limit associated with the non-sensitive metric for the integrated circuit design. Further, the operations can include, in response to the determining that the non-sensitive metric exceeds the optimization limit, rejecting the one of the plurality of solutions without performing evaluation of the one of the plurality of solutions for a sensitive metric.

In some embodiments, a computer program product for optimizing a design of an integrated circuit comprising a computer readable storage medium having computer usable program code embodied therewith, the computer usable program code. In some examples, the computer usable program code is configured to select one of a plurality of solutions for optimization of the design of the integrated circuit during physical synthesis. The computer usable program code can further be configured to, prior to a determination of whether an evaluation of a second metric should be performed for the one of the plurality of solutions, perform an evaluation of the one of a plurality of solutions for the first metric, wherein the evaluation of the first metric does not update one or more design documents for the integrated circuit, wherein the evaluation of the second metric, if performed, would update the one or more of the design documents, and wherein the update to the one or more of the design documents would have to be undone if the one of the plurality of solutions were to exceed a limitation of the second metric. The computer usable program code can further be configured to, based on the evaluation of the one of a plurality of solutions for the first metric, determine whether the one of the plurality of solutions exceeds a limitation for the first metric. The computer usable program code can further be configured to, if the one of the plurality of solutions exceeds the limitation for the first metric, determine that the evaluation of the second metric should not be performed.

In some embodiments, an apparatus comprises one or more processors and one or more computer-readable storage devices. In some examples, the one or more computer-readable storage devices are configured to store instructions, which when executed by at least one of the one or more processors, are configured to: select one of a plurality of solutions for optimization of an integrated circuit design during physical synthesis; perform a first evaluation of a metric on the one of the plurality of solutions prior to updating one or more design documents for the integrated circuit, wherein the update to the one or more of the design documents would have to be undone if the one of the plurality of solutions were to exceed a limitation of the second metric; determine, based on the first evaluation of the metric, whether the one of the plurality of solutions exceeds a limitation for the metric; and based on the first evaluation of the metric, if the one of the plurality of solutions exceeds the limitation for the metric, reject the solution in response to the determining that the one of the plurality of solutions exceeds the limitation for the metric, and if the one of the plurality of the solutions does not exceed the limitation for the metric, perform the second evaluation of the metric, wherein the second evaluation of the metric updates the one or more of the design documents.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
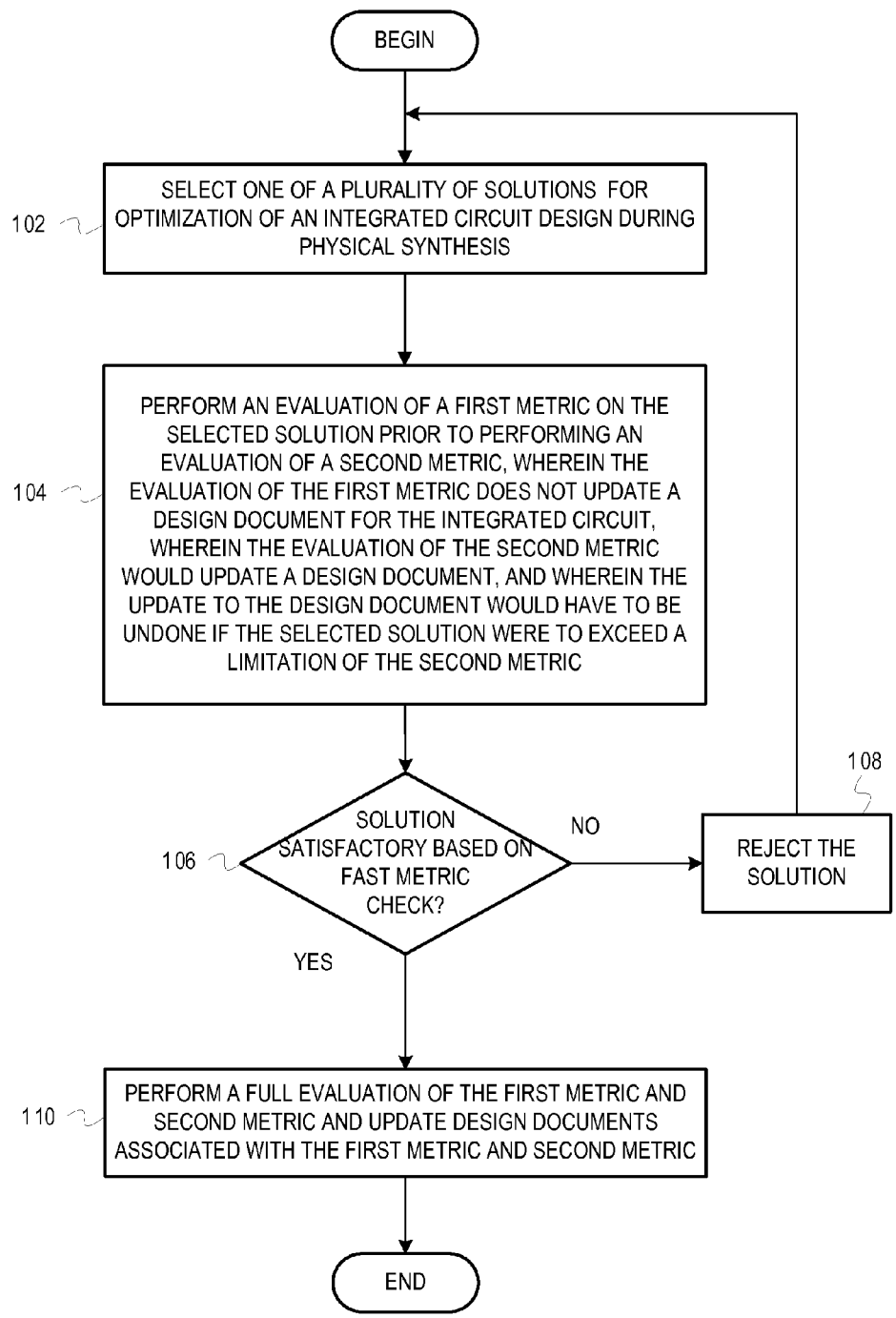
FIG. 1 illustrates one example of optimizing a solution for an integrated circuit design using a fast metric check, according to one embodiment

The description that follows includes exemplary systems, methods, techniques, instruction sequences and computer program products that embody techniques of the present inventive subject matter. However, it is understood that the described embodiments may be practiced without these specific details. For instance, although examples refer to optimization during physical synthesis, additional examples may include optimization during logical synthesis, or other stages of integrated circuit design. In other instances, well-known instruction instances, protocols, structures and techniques have not been shown in detail in order not to obfuscate the description.

As mentioned previously, the portion of the IC design process that includes determining the optimal configuration for the placement and connection of the components is referred to as physical synthesis. During physical synthesis, a design engineer receives a list ("netlist") of components, and produces a valid placement layout for the components. The netlist inlcudes a list of the components (e.g., as logical gates). Each of the components includes connection ports, or pins. The netlist connects the ports of the components using "nets" (e.g., the "wires").

Physical synthesis can be broken down into a flow that involves multiple parts. Some of the parts are referred to as "placement" stages, or simply "placement."During placement, a design engineer uses the netlist and the EDA tools (referred to herein more succinctly as design tools) to size and place simulated shapes for the electrical components on a placement grid which represents the size some, or all, of the IC. The goal of placement is to position the electrical components so that they fit on the size for the IC and also have the proper size and locations to best satisfy all aspects of the IC design related to physical positions on the substrate.

After placement, an additional stage involves optimizing the placement by modifying portions of the design to meet all timing constraints according to IC design rules. This optimization stage includes modifying gates, moving gates, adding buffers and/or inverters, reassigning layers, changing threshold voltages, and the like. Timing optimization algorithms are employed to ensure that the IC design meets all timing requirements. The changes made during this stage affect the timing performance of the IC; therefore, the optimization techniques are employed to ensure timing closure.

Additional stages of physical synthesis are referred to as "routing" stages, or simply "routing", wherein a design engineer uses the netlist, the placement grid, and the design tools to generate a routing (i.e., electrical connection) on the placement grid between the shapes of the components. The goal of routing is to ensure that all components are properly connected to their counterparts and to best satisfy all aspects of IC design related to wiring and connectivity.

During the physical synthesis flow, the design engineers have to try many different placement and routing configurations, and perform many optimizations for each based on various criteria, or metrics, such as metrics regarding timing, routability, signal integrity, density, area, power, heat, etc. The physical synthesis iteratively performs optimization operations that evaluate the metrics until settling on the best overall placement and routing. Some design engineers specialize in optimizing the placement and routing by running optimization operations that evaluate many different possible solutions for both placement and routing according to rudimentary models. In many cases, parts of the physical synthesis flow, or even the entire flow, are iterated a number of times, using different solutions until design closure is achieved.

As part of the physical synthesis process, the design tools perform optimization procedures which make many changes to the IC design (e.g., changes to the netlist). For example, a design tool may change or resize cells, add buffers, reassign layers, change a layout, change threshold voltage levels, move gates, modify wire sizes, move wires, etc. The design tool evaluates the changes to metrics of physical design that need to be monitored to improve timing, reduce power, reduce area, make sure congestion is not bad, etc. If the design tool determines, based on the evaluation of the metrics, that the changes to the IC design are unsatisfactory, then the design tool must restore the netlist to a previous state. The repetitive process of updating the netlist and restoring the netlist takes a significant amount of time and utilizes a tremendous amount of computing resources.

For example, during physical synthesis, the design tool utilizes a router algorithm ("router") to perform wire routing ("routing"). During routing, the router adds to the placement grid the wires, or routes, needed to properly connect the placed components while obeying all design rules for the IC. The routes represent wires which will be needed to deliver power, providing timing signals, communicate data, etc. The router receives the placement grid from the placement process. The grid is partitioned into rectangles referred to variously as bins, buckets, global cells (g-cells), or tiles (referred to hereafter as tiles). Each of the tiles may contain circuit components such as transistor gates which may be wired together within each of the tiles. Some of the wiring may go from tile to tile. Each of the boundaries between adjacent tiles is a global edge. The router then connects the components on each tile and also interconnects components across tile boundaries.

The design tool evaluates the routing according to many metrics. One metric, regarding the interconnections across tile boundaries, is "congestion." Congestion at a given edge of a tile is defined as the routing demand divided by the available track capacity, or as the difference between capacity and demand. Therefore, congestion typically increases as more nets cross tile edges. Congestion is tracked using a congestion map that shows the congestion of the routes on the grid.

Many routers follow a two step process by first determining an approximate path or course ("route") for each of the nets in the netlist on a course version of the placement grid. This step is called "global routing." Global routing limits the size and complexity of detailed routing steps. The next step is the detailed routing, which involves making very accurate wiring configurations. The routing can be a very complex process. The router, therefore, can use a heuristic algorithm to generate a group of the best possible routing configurations. Then, the router performs a repetitive process where (1) the router selects one of the routing configurations from the group of best possible routes, (2) the router routes the nets according to the configuration, and (3) the router determines whether all of the nets are successfully routed and/or if the routing metrics are satisfied. If the routing was not optimal (e.g., the nets are not successfully routed and/or the routing metrics are not satisfied), the router (4) applies a variety of "cleanup" methods. During the repetitive detailed routing process, the netlist is updated repeatedly for each one of the routing configurations that is fully evaluated. If the routing configuration was non-optimal, during the cleanup step, the netlist must be returned to its previous state by removing the changes made when the non-optimal routing configuration was evaluated. The repetitive process of updating the netlist and restoring the netlist during the detailed routing process takes a significant amount of time and utilizes a tremendous amount of computing resources. During full evaluation of each of the potential routing configurations, metric documents ("metric maps") are also updated and restored, such as the congestion map, a thermal map, a power map, etc. which further takes times and resources to change and restore.

Some embodiments of the inventive subject matter perform a fast evaluation of a metric prior to performing a full and accurate evaluation of the metric (or other metrics). In other words, a design tool, configured according to some embodiments, performs an abbreviated estimation of how a solution may affect one or more metrics, such as non-sensitive metrics. In the case of non-sensitive metrics, the design tool performs a non-sensitive metric check before committing the solution to a full transaction that evaluates all design rules, all criteria, and all metrics (both non-sensitive and sensitive). Furthermore, some embodiments include performing the fast evaluation of a metric without updating a design document, such as a netlist or a metric map. If the evaluation of the metric proves unsatisfactory for design criteria associated with the metric, then the solution is rejected and another solution is selected for evaluation. Because no design documents updates were made, then design document "undoes" are unnecessary. If, however, the fast evaluation of the metric proves satisfactory for design criteria associated with the metric, then the design document is updated and full evaluation can proceed.

FIG. 1 illustrates one example of optimizing a solution for an integrated circuit design using a fast metric check, according to one embodiment. In FIG. 1, a flow 100 involves several processing blocks associated with operations performed by a design tool. At processing block 102, the design tool first selects one of a plurality of solutions for optimization of an integrated circuit design during physical synthesis.

At processing block 104, the design tool performs a fast evaluation of a first metric ("fast metric check" or "fast incremental estimation"), such as for a non-sensitive metric on the one of the plurality of solutions ("the selected solution"). The design tool performs the fast metric check prior to performing a full evaluation of a second metric, such as a sensitive metric. For instance, the fast metric check involves performing an estimate of the first metric according to a fast optimization model (e.g., a Steiner route, a formula based thermal map update, or an Elmore delay). The fast metric check is different from a more accurate optimization model (e.g., a full incremental routing, a thermal map update using a Fast Fourier Transform, or a Simulation Program with Integrated Circuit Emphasis (SPICE) extraction and evaluation for timing). The accurate optimization model requires an update to a design document (e.g., an update to a netlist and/or an update to a metric map). The update to the design document would require an undo operation if, after a full, accurate metric check, the solution were to be found non-satisfactory. The fast metric check of the first metric, however, does not involve updating a design document. Therefore, at processing block 104, the design tool performs the fast metric check on the first metric without having to update the design document that, if evaluated fully, may need to be undone.

In some embodiments, the first metric is a "non-sensitive" metric and the second metric is a "sensitive" metric. A sensitive metric is a metric that changes disproportionately to even a small change to a design criterion. For example, when a design criterion changes, if the amount, or ratio, of change that occurs to a corresponding metric is more than approximately 10% what the metric was previously, then the metric may be considered a sensitive metric. Timing is an example of a sensitive metric. For instance, if a position of a gate is moved on a placement grid even a small distance, the impact that the change of the position has on the timing metric of the circuit can be enormous (e.g., the critical path, the arrival time, the required time, and the slack are all affected to such a degree that the IC, or portion of the IC, can become non-operable).

A non-sensitive metric, however, is a metric that does not change disproportionately to a small change to a design criterion. For instance, if a design criterion changes, if the metric associated with the design criterion does not change more than approximately 10%, then the metric may be considered a non-sensitive metric. Examples of non-sensitive metrics may include metrics associated with routing, area, density, heat, and power.

In some embodiments, a non-sensitive metric includes a metric which can change in degrees and whose effect on the design can be measured in degrees on the optimal performance of the integrated circuit as opposed to a sensitive metric, which if changed in any degree can cause the design to be non-functional. One example of a non-sensitive metric that is measured in degrees includes routing congestion ("congestion"). Congestion is a measure of a degree of spacing and/or density of nets on part, or all, of the placement grid. The amount of congestion at any given location on the IC can affect optimal performance of the IC depending on the degree of the congestion (e.g., noise or cross-talk effects increase with congestion). However, the integrated circuit is still functional throughout the varying degrees of congestion. There may, however, be a set an upper limit to the degree of the metric (e.g., a limit to the degree of congestion), which, if exceeded, would violate certain design criteria.

In some cases, a non-sensitive metric may be related to an absolute design constraint or rule, but, for optimization purposes, the constraint or rule does not have to be completely satisfied for the non-sensitive metric to be checked. For instance, net connectivity is a sensitive metric. If the circuit were fabricated with a missing wire, the IC could fail in whole or part. However, for the purposes of detecting the density, heat, etc. of some, or all, portions of a routing map for the IC (e.g., as in the case of congestion checking or thermal checking), the routing map can have one (or a few) missing nets. In other words, for testing congestion or thermal issues, a routing map with one (or a few) missing nets (out of thousands or millions of nets) is approximately equivalent to the routing map with no missing nets.

The fast metric check, mentioned previously, involves minimizing, or eliminating, changes to design documents that would need to be reversed if the solution was determined to be non-optimal after performing the full evaluation transaction. For example, the design tool performs the fast metric check before modifying a netlist or before modifying a metric document (e.g., a metric map) related to the metric.

At processing block 106, the design tool determines whether the solution is satisfactory after the fast metric check (e.g., if the solution meets one or more criteria, or limits, related to the first metric). If the solution is satisfactory, the design tool, at processing block 110, performs a full evaluation of all relevant design metrics (including non-sensitive and sensitive metrics), and updates design documents (e.g., updates a netlist and/or updates a metric map). For instance, as part of the full evaluation, the design tool updates a netlist. Further, the design tool performs a full evaluation of the first metric and the second metric using advanced estimation models. Further, the design tool updates metrics maps for one or both of the first metric and the second metric.

At processing block 106, if the design tool determines that that the solution is non-satisfactory based on the fast metric check, then, at processing block 108, the design tool rejects the solution and the flow 100 returns to processing block 102, where the design tool selects a different solution and repeats the operations of processing blocks 102 and 104 for the different solution. In some examples, because only one, or a few, metrics are quickly evaluated, or estimated, prior to committing to a full evaluation transaction against all design criteria, a solution can be quickly eliminated from consideration because it would not be optimal according to the results of the fast metric check.

Figure 2:
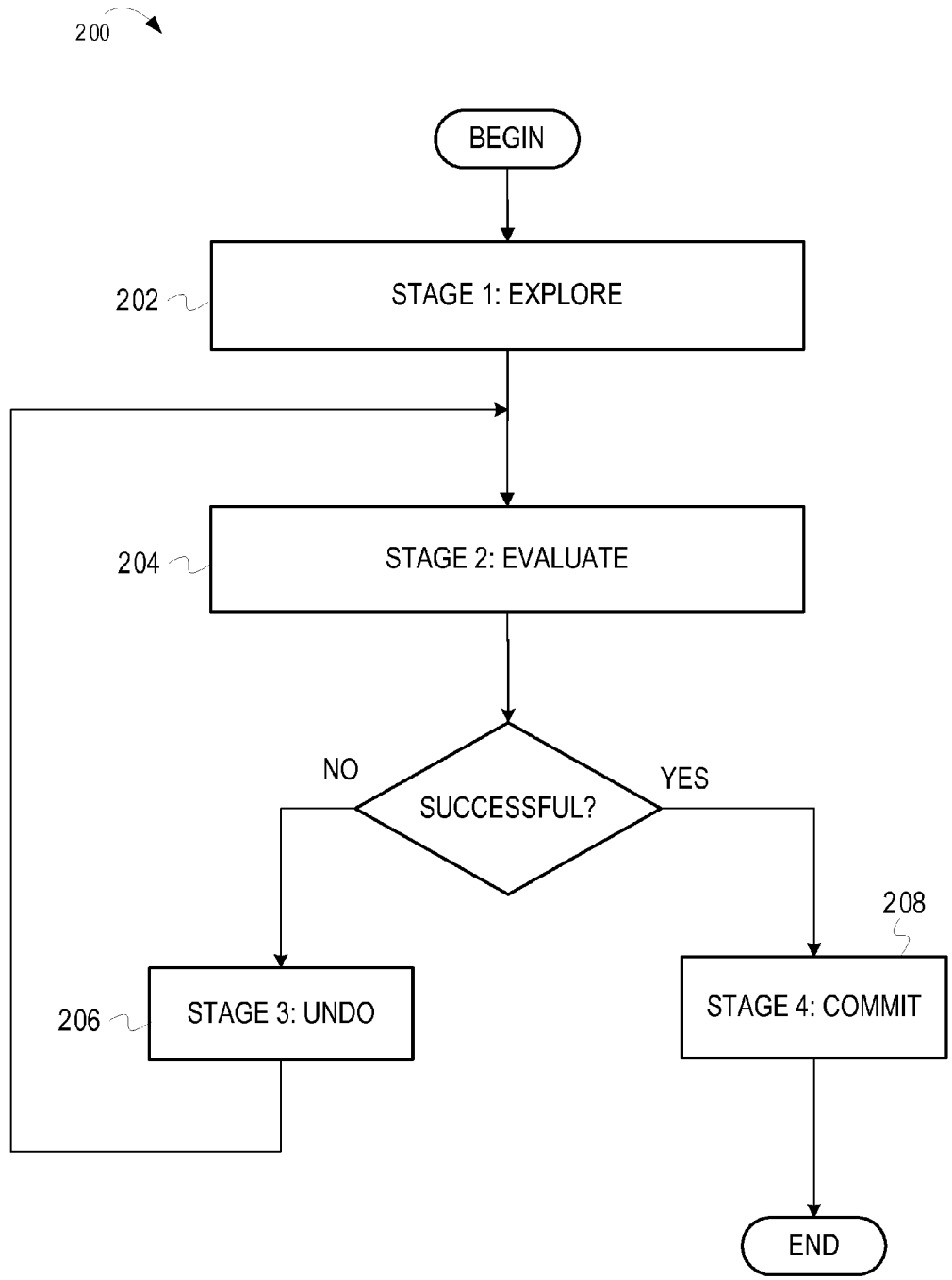
FIG. 2 illustrates an example flow 200 for physical synthesis optimization.

FIG. 2 illustrates an example flow 200 for physical synthesis optimization. The process of optimizing one or more elements of an IC design during the physical synthesis flow can be broken down into several general stages. The first stage is the "exploration" stage 202, where the design tool determines a solution to evaluate. A second optimization stage is the "evaluation" stage, which involves evaluating one or more elements of the solution, such as elements of integrated design related to placement, routing, power, heat, density, congestion, area, timing, and so forth. After the evaluation stage 204, if the solution satisfies specific design criteria then the solution is committed 206 and the physical synthesis flow ends. If the solution does not satisfy the specific design criteria, then changes, that at stage 208, the changes are undone, or rolled back and another solution is evaluated through repetition of the exploration stage 202 and evaluation stage 204. These general stages will be included in the descriptions of flows 300 and 400 in FIGS. 3 and 4 to help highlight the differences of the flows 300 and 400 from each other.

Figure 3:
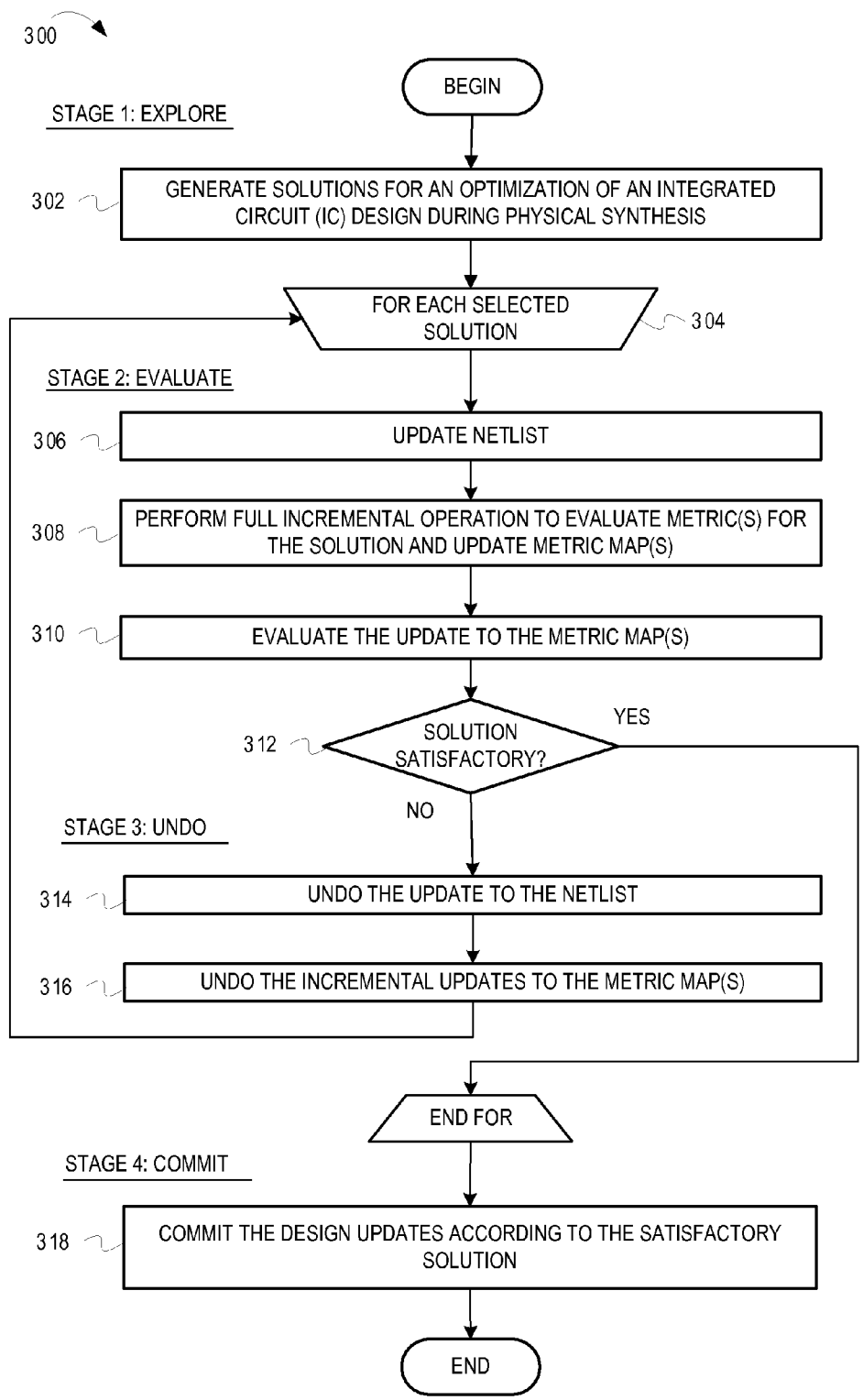
FIG. 3 illustrates an example flow 300 of an optimization without utilizing a fast metric check.

FIG. 3 illustrates a flow diagram (flow 300) without utilizing a fast metric check (e.g., without utilizing a non-sensitive metric check). Specifically, the flow 300 illustrates an example of performing optimization during physical synthesis and evaluating a congestion metric without utilizing a fast metric check. The flow 300 follows the general stages of FIG. 2 with detailed sub-processes.

At processing block 302, a design tool generates solutions for optimizing an IC design. The design tool utilizes a rudimentary model pertaining to one of various metrics associated with the optimization (e.g., timing model to evaluate timing, a routing model to evaluate routing, a power model to evaluate power, a thermal model to evaluate, etc.). The design tool utilizes the rudimental model to generate many solutions for possible modifications to the IC design. For example, each of the solutions may include a specific set of buffer insertion points from a larger set of all possible buffer insertion points, a specific set of layers from a larger set of all possible layers, a specific set of gate sizes from a larger set of all possible gate sizes, etc. For example, when optimizing the placement and route of a net, the design tool may specify various configurations for that particular net. At this stage, there may be tens of thousands of possible solutions for a potentially optimized IC design. Therefore, fast, and fairly inaccurate models are utilized to generate the solutions. For example, when optimizing placement of a net, a half-parameter wire-length model can be used in exploration stages. For buffering, an Elmore delay based dynamic programming can be used.

At processing block 304, the design tool selects the best solution from all of the solutions according to the model(s) used. The design tool selects the best solution, for example, by determining which of the solutions generated by a fast model has the best measurement for the selected metric associated with the model (e.g., select which solution has the best congestion, best timing or density, best wire-length improvement, etc. after being generated according to the rudimentary model).

At processing block 306, the design tool updates the netlist by implementing the changes indicated in the solution. For example, the design tool may add buffers, resize gates, reassign layers, modify threshold voltages of gates, etc. At processing block 308, the design tool performs an incremental operation to evaluate the metric and update the metric map. For example, the design tool performs incremental global routing and commits routes on the placement of objects in the placement map. The design tool evaluates congestion for the global routing. Based on wiring topology of the nets in the placement map, the design tool updates a congestion map that specifies the congestion (e.g., if a particular area on the congestion map shows congestion, then the system updates the metric map to show the congestion). At processing block 310, the design tool evaluates the change. For example, the design tool evaluates the timing of the IC design based on the changes.

At processing block 312, the design tool determines whether the solution satisfies all design criteria or not. If so, then the loop associated with processing block 304 ends and flow 300 continues at processing block 318 where the design tool commits the solution. If, at processing block 312, the design tool determines that the solution does not satisfy all design criteria, then the design tool performs "undo" operations. For example, at processing block 314, the design tool undoes the incremental updates to the netlist made at processing block 306 and 308. At processing block 36 the design tool further undoes updates to the metric map. As mentioned previously, performing "undo" operations to design documents takes significant amounts of time and resources. Some embodiments, such as the one described in FIG. 4, provide ways to avoid, or significantly reduce, undo operations, which can significantly speed up the optimization process.

Figure 4:
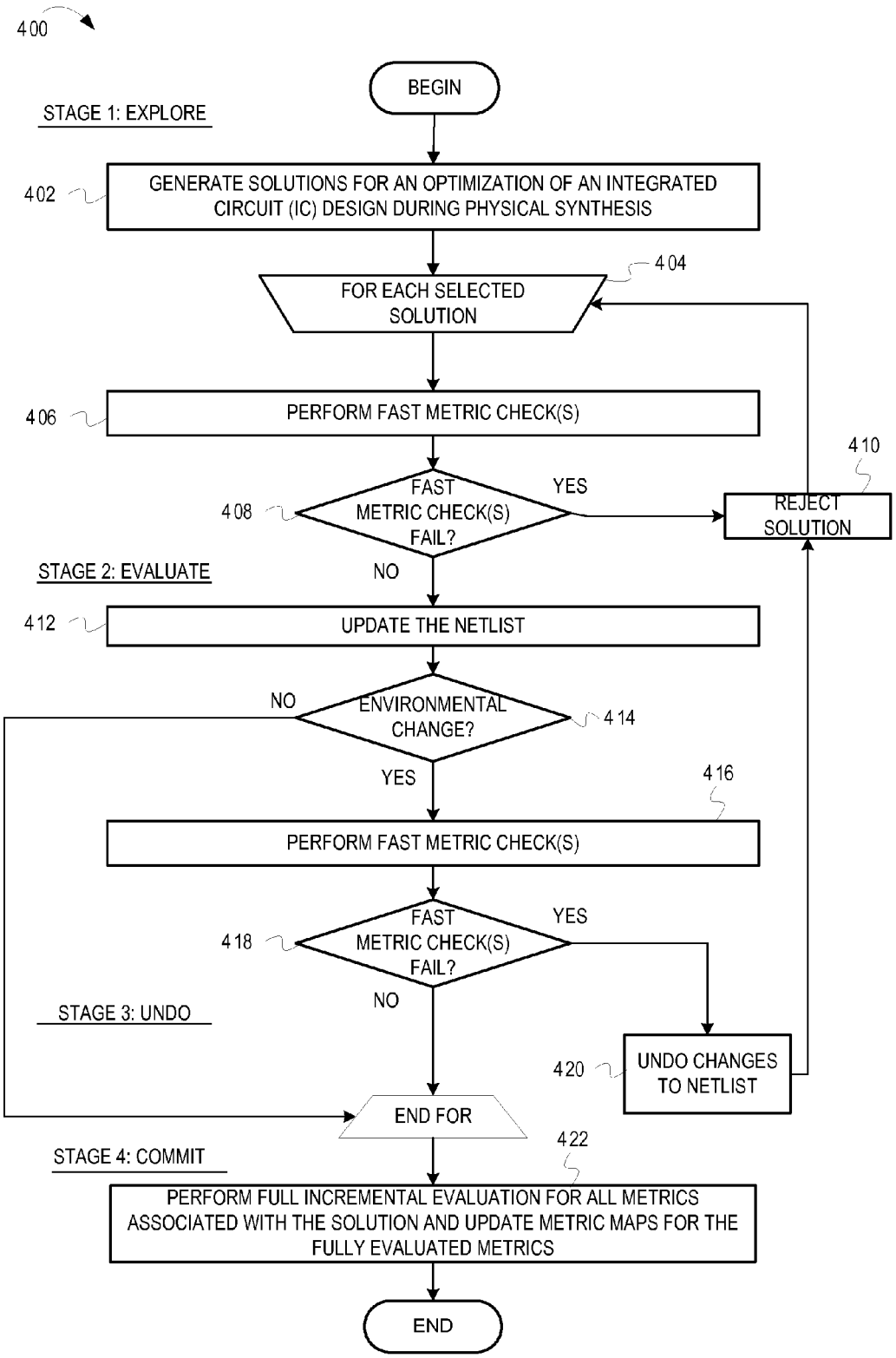
FIG. 4 illustrates an example flow 400 of optimization for physical synthesis using a fast metric check, according to one or more embodiments.

FIG. 4 illustrates a flow diagram (flow 400) according to one or more embodiments. The flow 400 follows the general stages of FIG. 2 with detailed sub-processes. At processing block 402, a design tool generates multiple solutions for optimizing an IC design using rudimentary models (similar to processing block 302 of flow 300).

At processing block 404, the design tool selects the best solution from the multiple solutions generated at processing block 402. The design tool performs a similar operation as that described at processing block 304 of flow 300.

At processing block 406, before entering the solution into the netlist and before evaluating the solution according to a full, or accurate update operation, the design tool performs a fast evaluation, or fast metric check, of one or more metrics (e.g., of a non-sensitive metric). This is contrary to the flow 300, where the design tool in flow 300 did not perform a fast metric check before making updates to, or evaluating, the netlist and/or before making changes to a metric map. For example, at processing block 406, when the design tool generates solutions regarding a timing metric (which is sensitive), instead of committing the best solutions for full evaluation according to timing, at processing block 406, the design tool checks a non-sensitive metric, such as congestion, density, power, thermal, or other such metrics. For example, the design tool performs a Steiner route of a net (or for multiple nets) for the proposed solution. The Steiner route will provide a rough estimate of congestion at tile edges. The Steiner route is different from a full incremental routing and/or routing map update. A full incremental routing involves a very accurate and time consuming evaluation of the routing metric. The Steiner route, however, provides a rough (though sufficient) estimate to determine whether the solution will meet design criteria regarding congestion.

In another example, such as for evaluating power or thermal metrics, the design tool can perform formula based power and thermal map updates, as opposed to a more accurate thermal map update using a Fast Fourier Transform. In a case of a timing metric for a design that is not timing critical (therefore, timing would not be a sensitive metric in that case), the design tool can utilize a simple delay model, such as an Elmore delay, as opposed to a SPICE extraction and evaluation for timing.

In some examples, for sensitive metrics, such as the timing metric for timing critical designs, the design tool may still perform a fast incremental evaluation of the metric (e.g., using the Elmore delay). Furthermore, the design tool does not update the metric map. Therefore, at this point in the flow 400, there has been no update to the netlist or to the metric map.

At processing block 408, the design tool determines whether the solution passed or failed the fast metric check performed at processing block 406. In other words, if the solution is non-optimal for the metric (e.g., does not meet minimum threshold limitations for the metric), the design tool, at processing block 410, eliminates the solution from consideration and returns to processing block 404, where the design tool selects the next best solution for the net(s) and then repeats the operations of processing block 406 by performing another fast metric check of the metric (e.g., the non-sensitive metric using the fast estimation model). For example, if at processing block 406, the design tool performs a congestion check for the solution, and if, at processing block 408, the design tool determines that that the net or nets associated with the solution would have unacceptable congestion per congestion criteria for the IC design, then at processing block 410, the design tool eliminates the solution and the flow 400 returns to processing block 404. At processing block 406, the design tool would then perform another congestion check on the next best solution. If, at processing block 408, the design tool determines that the next best solution failed the congestion check, the design tool, at processing block 410, would reject that next best solution, and so forth until one of the solutions generated at processing block 402 passed the congestion check.

If, at processing block 408, the design tool determines that the solution does satisfy the minimum threshold criteria for the metric that was checked at processing block 406, then at processing block 412, the design tool incrementally updates the netlist (e.g., the design tool routes a net(s), adds a buffer (s), resizes a gate(s), reassigns the net(s) to a different metal layer(s), modifies a threshold voltage(s) of the gate(s), etc.). The design tool, however, does not yet perform a full, accurate evaluation of the solution nor does the design tool update the metric map.

At processing block 414, the design tool then evaluates whether the update to the netlist has caused any environmental difference. For example, while updating the netlist with the solution, the design tool may have to make some minor changes, such as to the placement of a circuit element or to the topology of the net(s) in the solution. In some cases, however, even a minor change can have a major impact on the viability of the solution. Thus, the design tool detects differences between what was indicated in the solution and what results after updating the netlist (e.g., placement legalization issues occur) which are caused by the minor changes during the updating of the netlist.

If, at processing block 414, the design tool determines that there is an environmental difference, then, at processing block 416, the design tool will perform the fast metric check again, for the solution, for the metric that was evaluated at processing block 416.

At processing block 418, the design tool again determines whether the solution passes or fails the fast metric check. If, at processing block 418, the design tool determines that the solution fails the fast metric check, then the flow 400 continues at processing block 420, where the design tool undoes the updates to the netlist and the flow returns to processing block 410 where the design tool eliminates the solution from consideration. The flow 400 then returns to processing block 404 where the design tool selects the next best solution (e.g., the next best route(s), the next best placement(s), the next best gate size(s), etc.) and then repeats the operations of the flow 400 from that point in the flow 400 onward for the next best solution.

However, at processing block 418, if the design tool determines that the solution still satisfies the minimum requirement for the metric that was tested at processing block 416, then the loop associated with processing block 402 ends and the design tool commits the solution. The flow proceeds to processing block 422.

At processing block 422, the design tool performs a full evaluation of the solution using accurate models for all metrics associated with the solution, including non-sensitive and sensitive metrics. For example, at processing blocks 408 and 418, the design tool may have only tested for a non-sensitive metric or metrics, such as congestion. However, at processing block 422, the design tool evaluates for all metrics, such as congestion and timing, using accurate models. For example, the design tool can utilize a full incremental routing model (for evaluating a routing metric), a thermal map update with a Fast Fourier Transform operation (for evaluating a thermal metric), a SPICE extraction and evaluation (for evaluating a timing metric), and so forth. The design tool updates the metric map(s) for the metrics in accordance with the full incremental evaluation of the solution for the metrics (e.g., if the route for the net(s) satisfy all design criteria and rules, including for congestion, then the design tool updates the relevant metric maps, such as the congestion map, for the evaluated net(s)).

In the example described in FIG. 4, if a congestion check is performed during the "Explore" stage (which acts as a pre-filter to remove potentially bad solutions before spending the time and resources of full evaluation), then the process for finding the optimal solution significantly speeds up. For instance, if no incremental routing is performed during the "Evaluation" stage (e.g. no updates to metric maps during "Evaluation"), and instead only the fast estimations, or fast metric checks, (e.g., Steiner routes) are utilized, then the incremental router gets called much less often, which increases the speed of physical synthesis many fold. For example, according to a prior art technique, if there are 3000 potential solutions, and ultimately only 1000 of the solutions were determined to be satisfactory solutions after performing the full incremental routing, then a prior-art design tool would call the incremental router at least 3000 times for the full evaluations, then the prior-art design tool would have to call the incremental router to undo the updates made to the metric maps for the 2000 non-satisfactory solutions. Therefore, the prior art design tool would have to call the incremental router 5000 times. However, a design tool configured according to some embodiments of the present inventive subject matter (such as the design tool described in FIGS. 1 and 4), would perform the fast metric checks prior to calling the incremental router and, thus, would eliminate the 2000 non-satisfactory solutions before calling the incremental router. Thus, the incremental router would only get called 1000 times for the satisfactory solutions. Further, there would be no undoing of incremental changes to metric maps for the 2000 non-satisfactory solutions because the metric maps would not be changed for those 2000 non-satisfactory solutions. Consequently, the design tool of FIG. 4 would only call the incremental router 1000 times as compared to 5000 times, thus greatly increasing the speed of the optimization process.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
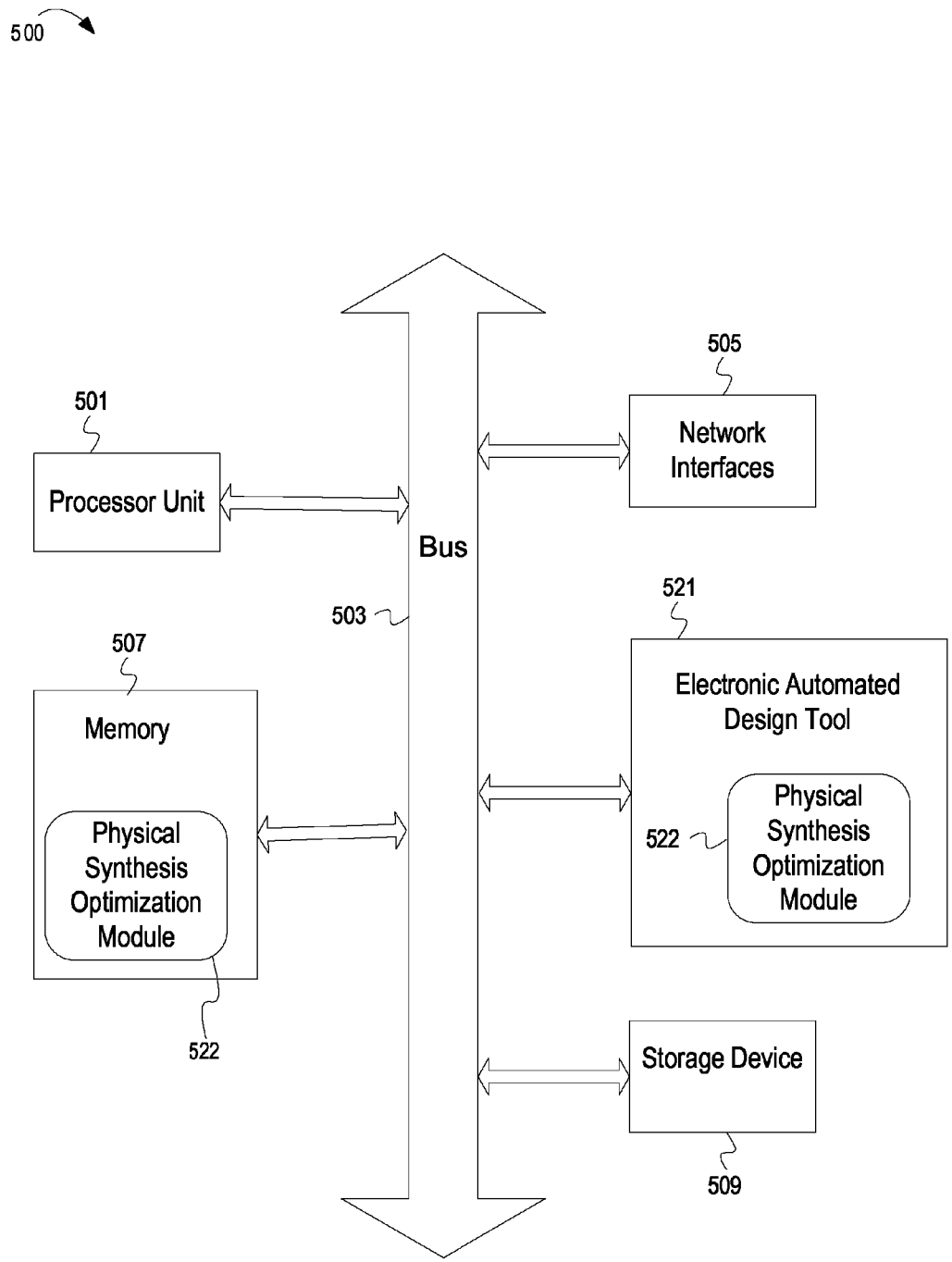
FIG. 5 depicts an example computer system

FIG. 5 depicts an example computer system. A computer system 500 includes a processor unit 501 (possibly including multiple processors, multiple cores, multiple nodes, and/or implementing multi-threading, etc.). The computer system 500 includes memory 507. The memory 507 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system 500 also includes a bus 503 (e.g., PCI, ISA, PCI-Express, HyperTransport®, InfiniBand®, NuBus, etc.), a network interface 505 (e.g., an ATM interface, an Ethernet interface, a Frame Relay interface, SONET interface, wireless interface, etc.), and a storage device(s) 509 (e.g., optical storage, magnetic storage, etc.). The system memory 507 embodies functionality to implement embodiments described above. The system memory 507 may include a physical synthesis optimization module 522 configured to provide one or more functionalities that facilitate electronic automated design. For example, some or all of the functionality described herein may be implemented with code embodied in the memory and/or processor, co-processors, other cards, etc. Any one of these functionalities may be partially (or entirely) implemented in hardware and/or on the processing unit 501. For example, the functionality may be implemented with an application specific integrated circuit, in logic implemented in the processing unit 501, in a co-processor on a peripheral device or card, in an electronic automated design tool 521, etc. Further, realizations may include fewer or additional components not illustrated in FIG. 5 (e.g., video cards, audio cards, additional network interfaces, peripheral devices, etc.). The processor unit 501, the storage device(s) 509, and the network interface 505 are coupled to the bus 503. Although illustrated as being coupled to the bus 503, the memory 507 may be coupled to the processor unit 501.

While the embodiments are described with reference to various implementations and exploitations, it will be understood that these embodiments are illustrative and that the scope of the inventive subject matter is not limited to them. In general, techniques for optimizing an integrated circuit for physical synthesis as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method of optimizing a design for an integrated circuit for a physical synthesis stage of an integrated-circuit design process, the method comprising:
   selecting one of a plurality of solutions for optimization of the design for the integrated circuit;
   performing, via at least one processor, an evaluation of the one of the plurality of solutions for a non-sensitive metric without modification to a netlist for the integrated circuit, wherein the netlist would require modification if the one of the plurality of solutions were to be evaluated for a sensitive metric, wherein the non-sensitive metric is metric that changes by less than approximately ten percent when any of the plurality of solutions is evaluated, and wherein the sensitive metric is a metric that changes by more than approximately ten percent when any of the plurality of solutions is evaluated;
   determining, based on the evaluation of the one of the plurality of solutions for the non-sensitive metric, that the non-sensitive metric exceeds an optimization limit associated with the non-sensitive metric for the integrated circuit design; and
   in response to the determining that the non-sensitive metric exceeds the optimization limit, rejecting the one of the plurality of solutions without performing evaluation of the one of the plurality of solutions for the sensitive metric.

2. The method of claim 1, wherein the non-sensitive metric comprises a metric for one or more of routing, area, density, heat, and power, and wherein the sensitive metric comprises a metric for timing.

3. The method of claim 1, wherein the evaluation of the one of the plurality of solutions for the non-sensitive metric comprises one or more of use of a steiner route, use of a formula based thermal map update, use of a formula based power map update, and use of an Elmore delay.

4. The method of claim 1 further comprising:
   selecting an additional one of a plurality of solutions for optimization of the integrated circuit design during the physical synthesis;
   performing an evaluation of the additional one of a plurality of solutions for the non-sensitive metric without updating a netlist for the integrated circuit;
   based on the evaluation of the additional one of a plurality of solutions for the non-sensitive metric, determining that the additional one of the plurality of solutions is satisfactory for the non-sensitive metric;
   after the determining that the additional one of the plurality of solutions is satisfactory for the non-sensitive metric, updating the netlist based information from the additional one of the plurality of solutions;
   determining that an environmental change occurs to a design for the integrated circuit after updating the netlist;
   performing an additional evaluation of the additional one of the plurality of solutions for the non-sensitive metric, wherein the additional evaluation of the additional one of the plurality of solutions for the non-sensitive metric does not update a metric map associated with the non-sensitive metric;
   determining, based on the additional evaluation of the additional one of the plurality of solutions for the non-sensitive metric, that the additional one of the plurality of solutions exceeds the limitation for the non-sensitive metric; and
   in response to the determining that the additional one of the plurality of solutions exceeds the limitation for the non-sensitive metric, preventing the evaluation of the one of the plurality of solutions for the sensitive metric.

5. The method of claim 1 further comprising:
   selecting an additional one of a plurality of solutions for optimization of the integrated circuit design during physical synthesis;
   performing an evaluation of the additional one of a plurality of solutions for the non-sensitive metric without updating a netlist for the integrated circuit;
   determining, based on the evaluation of the additional one of a plurality of solutions for the non-sensitive metric, that the additional one of the plurality of solutions is satisfactory for the non-sensitive metric;
   updating a netlist for the integrated circuit based information from the additional one of the plurality of solutions;
   after updating the netlist, performing an additional evaluation of the additional one of the plurality of solutions for the non-sensitive metric without updating a metric map associated with the non-sensitive metric;
   based on the additional evaluation of the additional one of the plurality of solutions for the non-sensitive metric, determining that the additional one of the plurality of solutions is satisfactory for non-sensitive metric; and
   in response to the determining that the additional one of the plurality of solutions is satisfactory for the non-sensitive metric performing one or more of an evaluation of the additional one of the plurality of solutions for the sensitive metric and an update to the metric map for the non-sensitive metric.

6. A computer program product for optimizing a design of an integrated circuit, the computer program product comprising:
- a non-transitory computer readable storage medium having computer usable program code embodied therewith, the computer usable program code comprising a computer usable program code configured to:
  - select one of a plurality of solutions for optimization of the design of the integrated circuit during physical synthesis,
  - prior to a determination of whether an evaluation of a second metric should be performed for the one of the plurality of solutions, perform an evaluation of the one of a plurality of solutions for a first metric, wherein the evaluation of the first metric does not update one or more design documents for the integrated circuit, wherein the design document is one or more of a netlist and a metric map, wherein the evaluation of the second metric, if performed, would update the one or more of the design documents, wherein the update to the one or more of the design documents would have to be undone if the one of the plurality of solutions were to exceed a limitation of the second metric, wherein the first metric is a metric that changes by less than approximately ten percent when any of the plurality of solutions is evaluated, and wherein the second metric is a metric that changes by more than approximately ten percent when any of the plurality of solutions is evaluated,
  - based on the evaluation of the one of a plurality of solutions for the first metric, determine whether the one of the plurality of solutions exceeds a limitation for the first metric, and
  - if the one of the plurality of solutions exceeds the limitation for the first metric, determine that the evaluation of the second metric should not be performed.

7. The computer program product of claim 6, wherein the computer usable program code is configured to, based on the evaluation of the first metric, perform the update to the one or more of the design documents if the one of the plurality of solutions does not exceed the limitation for the first metric.

8. The computer program product of claim 7, wherein the update to the one or more of the design documents comprises updating a netlist, and wherein the computer usable program code is further configured to perform an additional evaluation of the first metric, wherein the additional evaluation of the first metric does not update a metric map for the first metric.

9. The computer program product of claim 8, wherein the computer usable program code is further configured to determine whether an environmental change occurs to a design for the integrated circuit after updating the netlist, and wherein if an environmental change occurs to the design for the integrated circuit after updating the netlist, the computer usable program code is further configured to
- perform an additional evaluation of the first metric, wherein the additional evaluation of the first metric does not update a metric map for the first metric, and
- prevent the evaluation of the second metric if, based on the additional evaluation, the one of the plurality of solutions exceeds the limitation for the first metric.

10. The computer program product of claim 6, wherein the first metric comprises a metric for one or more of routing, area, density, heat, and power, and wherein the second metric comprises a metric for timing.

11. The computer program product of claim 6, wherein the evaluation of the first metric comprises one or more of use of a steiner route, use of a formula based thermal map update, use of a formula based power map update, and use of an Elmore delay.

12. The computer program product of claim 6, wherein the first metric is a metric that is measured in a plurality of degrees and wherein the integrated circuit is functional for at least two of the plurality of the degrees, and wherein the second metric is measured in two degrees and wherein the integrated circuit is functional for a first of the two degrees and non-functional for a second of the two degrees.

13. An apparatus comprising:
- one or more processors; and
- one or more computer-readable storage devices configured to store instructions, which when executed by at least one of the one or more processors, are configured to
  - select one of a plurality of solutions for optimization of an integrated circuit design during physical synthesis,
  - perform a first evaluation of a first metric on the one of the plurality of solutions prior to updating one or more design documents for the integrated circuit, wherein the one or more of design documents is one or more of a netlist and a metric map, wherein the update to the one or more of the design documents would have to be undone if the one of the plurality of solutions were to exceed a limitation of a second metric, wherein the first metric changes by less than approximately ten percent when any of the plurality of solutions is evaluated, wherein the first metric is measured in a plurality of degrees, and wherein the integrated circuit is functional for at least two of the plurality of the degrees,
  - determine, based on the first evaluation of the first metric, whether the one of the plurality of solutions exceeds a limitation for the first metric, and
  - based on the first evaluation of the first metric,
    - if the one of the plurality of solutions exceeds the limitation for the first metric, reject the solution in response to the determining that the one of the plurality of solutions exceeds the limitation for the first metric, and
    - if the one of the plurality of the solutions does not exceed the limitation for the first metric, perform a second evaluation of the first metric, wherein the second evaluation of the first metric updates the one or more of the design documents.

14. The apparatus of claim 13, wherein the first evaluation comprises one or more of use of a steiner route, use of a formula based thermal map update, use of a formula based power map update, and use of an Elmore delay and wherein the second evaluation comprises one or more of a full incremental routing transaction, use of a Fast Fourier Transform, and a SPICE extraction and evaluation.

* * * * *